(12) United States Patent
Hashimoto

(10) Patent No.: US 10,449,577 B2
(45) Date of Patent: Oct. 22, 2019

(54) SUBSTRATE PROCESSING APPARATUS

(71) Applicant: SCREEN Holdings Co., Ltd., Kyoto (JP)

(72) Inventor: Koji Hashimoto, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 15/427,445

(22) Filed: Feb. 8, 2017

(65) Prior Publication Data

US 2017/0232485 A1 Aug. 17, 2017

(30) Foreign Application Priority Data

Feb. 12, 2016 (JP) .................................. 2016-24955

(51) Int. Cl.
*B08B 13/00* (2006.01)
*B08B 3/04* (2006.01)
(Continued)

(52) U.S. Cl.
CPC .............. *B08B 13/00* (2013.01); *B05B 13/04* (2013.01); *B08B 3/041* (2013.01); *B08B 3/08* (2013.01);
(Continued)

(58) Field of Classification Search
None
See application file for complete search history.

(56) References Cited

U.S. PATENT DOCUMENTS

2003/0170988 A1* 9/2003 Izumi ...................... B05B 7/066
  438/689
2004/0159343 A1* 8/2004 Shimbara ............. G11B 23/505
  134/33

(Continued)

FOREIGN PATENT DOCUMENTS

JP 01-249414 A 10/1989
JP 2002-177856 A 6/2002
(Continued)

OTHER PUBLICATIONS

Fissan et. al., "Nanoparticle Contamination Control for EUVL-Technology", Conference Paper in Proceedings of SPIE—The International Society for Optical Engineering, May 2009., pp. 73640N1-73640N10.

*Primary Examiner* — Jason Y Ko
*Assistant Examiner* — Cristi J Tate-Sims
(74) *Attorney, Agent, or Firm* — Ostrolenk Faber LLP

(57) ABSTRACT

A substrate processing apparatus includes a chamber, a substrate holding unit, an elevated/lowered member, and an elevation/lowering driving unit. The chamber includes a base plate having an upper surface that defines a housing space. The substrate holding unit is housed in the housing space, is placed on the upper surface of the base plate, and holds a substrate. The elevated/lowered member is elevated and lowered inside the housing space. The elevation/lowering driving unit drives the elevation and lowering of the elevated/lowered member. The elevation/lowering driving unit includes a driving source, disposed higher than a lower surface of the base plate, and an elevating/lowering head, which is connected to a guard and is moved vertically by the driving source within a movable range in which an entirety of the head is positioned higher than the lower surface of the base plate.

16 Claims, 8 Drawing Sheets

(51) Int. Cl.
  *B08B 3/08* (2006.01)
  *H01L 21/67* (2006.01)
  *H01L 21/687* (2006.01)
  *B05B 13/04* (2006.01)

(52) U.S. Cl.
  CPC .... *H01L 21/6719* (2013.01); *H01L 21/67051* (2013.01); *H01L 21/68728* (2013.01); *H01L 21/68742* (2013.01); *H01L 21/68764* (2013.01); *H01L 21/68785* (2013.01)

(56) References Cited

U.S. PATENT DOCUMENTS

| | | | |
|---|---|---|---|
| 2004/0261817 A1 | 12/2004 | Araki et al. | 134/2 |
| 2007/0227444 A1* | 10/2007 | Nishide | G03F 7/16 118/52 |
| 2009/0320885 A1 | 12/2009 | Inoue et al. | 134/104.2 |
| 2010/0111651 A1* | 5/2010 | Dawson | H01L 21/68742 414/222.04 |
| 2011/0049100 A1* | 3/2011 | Han | H01J 37/32623 216/67 |
| 2011/0073040 A1* | 3/2011 | Hashimoto | H01L 21/67017 118/728 |
| 2012/0175819 A1 | 7/2012 | Miya et al. | 264/334 |
| 2012/0255193 A1 | 10/2012 | Tamura | 34/397 |
| 2016/0329219 A1* | 11/2016 | Lee | H01L 21/67046 |

FOREIGN PATENT DOCUMENTS

| | | |
|---|---|---|
| JP | 2009-124041 A | 6/2009 |
| JP | 2009-188168 A | 8/2009 |
| JP | 2010-010421 A | 1/2010 |
| JP | 2011-135009 A | 7/2011 |
| JP | 2012-146696 A | 8/2012 |
| JP | 2013-051265 A | 3/2013 |
| KR | 10-2014-0132601 A | 11/2014 |
| KR | 10-2015-0078631 A | 7/2015 |

* cited by examiner

SUBSTRATE PROCESSING APPARATUS

BACKGROUND OF THE INVENTION

1. Field of the Invention

The present invention relates to a substrate processing apparatus that processes a substrate by a liquid. Examples of substrates to be processed include semiconductor wafers, substrates for liquid crystal displays, substrates for plasma displays, substrates for FEDs (Field Emission Displays), substrates for optical disks, substrates for magnetic disks, substrates for magneto-optical disks, substrates for photomasks, ceramic substrates, substrates for solar cells, etc.

2. Description of the Related Art

With a single substrate processing type substrate processing apparatus that processes a substrate one by one, processing of the substrate by a processing liquid, such as a chemical liquid and rinse liquid, is performed inside a chamber. A spin chuck that holds the substrate and a motor that rotates the spin chuck are provided inside the chamber. Besides these, a plurality of guards that surround the spin chuck and a shielding plate that faces the substrate held by the spin chuck may be provided inside the chamber.

Processing liquids splashing from the substrate during the processing of the substrate by the processing liquids are received separately according to each type of processing liquid by the guards. To switch the receiving guard according to the type of processing liquid, the plurality of guards must be elevated and lowered. Also, when a guard is unnecessary, the guard must be lowered lower than the substrate.

The shielding plate shields an atmosphere in a vicinity of an upper surface of the substrate from a periphery when removing a processing liquid from the substrate. When a processing liquid is to be supplied to the substrate, the shielding plate must be elevated to make the shielding plate retract from the vicinity of the upper surface of the substrate. When the substrate is to be dried, the shielding plate must be lowered to make the shielding plate approach the vicinity of the upper surface of the substrate.

The substrate processing apparatus is thus provided with units arranged to elevate and lower members, such as the shielding plate and the guards.

For example, a substrate processing apparatus according to Japanese Patent Application Publication No. 2013-51265 includes an elevating/lowering unit arranged to elevate and lower a cup that surrounds the spin chuck. The elevating/lowering unit includes a shaft, connected to a bottom portion of the cup, a ball thread nut, screwed onto the shaft, and a servo motor that rotates the ball thread nut. By rotation of the ball thread nut, the shaft moves vertically. The cup is thereby elevated and lowered.

SUMMARY OF THE INVENTION

With the substrate processing apparatus according to Japanese Patent Application Publication No. 2013-51265, the servo motor and a lower end of the shaft are positioned lower than a base. There is thus a problem that the substrate processing apparatus becomes large in a vertical direction. Especially in a case where a plurality of substrate processing apparatuses (units) are stacked, a dimension of an entirety in the vertical direction becomes significantly large.

An object of the present invention is thus to provide a substrate processing apparatus, which, while including an elevation/lowering driving unit that drives elevation and lowering of an elevated/lowered member, is suppressed in dimension in a vertical direction.

The present invention provides a substrate processing apparatus including a chamber, including a base plate having an upper surface that defines a lower side of a housing space, a substrate holding unit that is housed in the housing space of the chamber, is placed on the upper surface of the base plate, and holds a substrate, an elevated/lowered member that is elevated and lowered inside the housing space of the chamber, and an elevation/lowering driving unit, which drives the elevation and lowering of the elevated/lowering member. The elevation/lowering driving unit includes a driving source disposed higher than a lower surface of the base plate, and an elevating/lowering head that is connected to the elevated/lowered member and is moved vertically by the driving source within a movable range in which an entirety of the elevating/lowering head is positioned higher than the lower surface of the base plate.

With the present arrangement, the elevation/lowering driving unit drives the elevation and lowering of the elevated/lowered member. In the elevation/lowering driving unit, the driving source and the elevating/lowering head are disposed higher than the lower surface of the base plate even when the elevating/lowering head is positioned at a lowest side of the movable range. A dimension of the substrate processing apparatus in a vertical direction can thus be suppressed in comparison to an arrangement where the driving source and the elevating/lowering head are disposed lower than the lower surface of the base plate.

In the preferred embodiment of the present invention, the driving source is housed inside the housing space of the chamber. With the present arrangement, the driving source is housed in the housing space of the chamber. Dimensions of the substrate processing apparatus in the vertical direction and horizontal directions can thus be suppressed.

In the preferred embodiment of the present invention, an entirety of the driving source is disposed at a side of the movable range of the elevating/lowering head. With the present arrangement, the entirety of the driving source is disposed at the side of the movable range of the elevating/lowering head. A dimension of the elevation/lowering driving unit in the vertical direction can thus be suppressed. The dimension of the substrate processing apparatus in the vertical direction can thus be suppressed further.

In the preferred embodiment of the present invention, the driving source includes a rotation driving source that rotates a horizontally extending rotating shaft, and the elevation/lowering driving unit includes a rotation transmitting unit that transmits the rotation of the rotating shaft to the elevating/lowering head to move the elevating/lowering head vertically. With the present arrangement, the elevating/lowering head can be moved vertically by transmitting the rotation of the horizontally extending rotating shaft to the elevating/lowering head. Therefore, even when a driving source that is long in an axial direction of the rotating shaft is used, the dimension of the elevation/lowering driving unit in the vertical direction can be suppressed.

In the preferred embodiment of the present invention, the rotation transmitting unit includes a plurality of rack teeth, fixed to the elevating/lowering head and aligned vertically, and pinion teeth, which are engaged with the rack teeth and to which the rotation of the rotating shaft is transmitted. With the present arrangement, the rotation of the rotating shaft, disposed at a side of the elevating/lowering head, can be transmitted to the elevating/lowering head by a simple arrangement that includes the mutually engaging rack teeth and pinion teeth. It is thus easy to dispose the entirety of the driving source at the side of the movable range of the elevating/lowering head. The dimension of the elevation/lowering driving unit in the vertical direction can thus be suppressed even further.

In the preferred embodiment of the present invention, the driving source includes a rotation driving source that rotates a vertically extending rotating shaft. The elevation/lowering driving unit includes a rotation transmitting unit that transmits the rotation of the rotating shaft to the elevating/lowering head to move the elevating/lowering head vertically. With the present arrangement, the elevating/lowering head can be moved vertically by transmitting the rotation of the vertically extending rotating shaft to the elevating/lowering head. Therefore, the dimension of the elevation/lowering driving unit in the vertical direction can be suppressed while disposing the driving source with the axial direction of the rotating shaft being directed vertically.

In the preferred embodiment of the present invention, the rotation transmitting unit includes a vertically extending thread shaft, to which the rotation of the rotating shaft is transmitted, and a nut, fixed to the elevating/lowering head and screwed onto the thread shaft. With the present arrangement, the rotation of the rotating shaft can be transmitted to the elevating/lowering head by a simple arrangement that includes the thread shaft and the nut screwed thereonto. The dimension of the elevation/lowering driving unit in the vertical direction can thus be suppressed even further.

In the preferred embodiment of the present invention, the elevation/lowering driving unit includes a guiding unit that guides the vertical movement of the elevating/lowering head. With the present arrangement, the vertical movement of the elevating/lowering head is guided by the guiding unit. The elevating/lowering head can thus be moved vertically accurately and with stability. A distance between the elevating/lowering head and another member can thus be shortened.

In the preferred embodiment of the present invention, the guiding unit includes a guide member, fixed to the chamber and recess-projection engaged slidably with the elevating/lowering head. With the present arrangement, the vertical movement of the elevating/lowering head can be guided by a simple arrangement in which the elevating/lowering head and the guide member are recess-projection engaged. The dimension of the elevation/lowering driving unit in the vertical direction can thus be suppressed even further.

In the preferred embodiment of the present invention, the elevated/lowered member includes a guard surrounding the substrate holding unit. The elevation/lowering driving unit includes a guard elevation/lowering driving unit that elevates and lowers the guard. With the present arrangement, the dimension of the substrate processing apparatus in the vertical direction can be suppressed even when the substrate processing apparatus includes the guard that surrounds the substrate holding unit.

In the preferred embodiment of the present invention, the elevated/lowered member includes a shielding plate that faces an upper surface of the substrate held by the substrate holding unit. The elevation/lowering driving unit includes a shielding plate elevation/lowering driving unit that elevates and lowers the shielding plate. With the present arrangement, the dimension of the substrate processing apparatus in the vertical direction can be suppressed even when the substrate processing apparatus includes the shielding plate that faces the upper surface of the substrate.

In the preferred embodiment of the present invention, the substrate processing apparatus further includes an isolating member that isolates the elevation/lowering driving unit from an atmosphere inside the housing space inside the chamber. With the present arrangement, the elevation/lowering driving unit is isolated from the atmosphere inside the housing space inside the chamber by the isolating member. The driving source and the elevating/lowering head can thus be disposed higher than the lower surface of the base plate regardless of amount or type of substance that splashes or scatters in the atmosphere inside the housing space of the chamber.

In the preferred embodiment of the present invention, the substrate processing apparatus further includes a coiled wiring that is connected to the shielding plate and is extensible and contractible vertically, a wiring guide that is elevated and lowered together with the shielding plate and guides the extension and contraction of the wiring, and an isolating member that isolates the shielding plate elevation/lowering driving unit from an atmosphere inside the housing space of the chamber. The isolating member includes a bellows that is extensible and contractible vertically and houses the wiring and the wiring guide.

With the present arrangement, the coiled wiring is connected to the shielding plate and is extensible and contractible vertically. A dimension of the coiled wiring in the vertical direction is thus adjusted in accordance with the elevation and lowering of the shielding plate. Therefore, in comparison to a case of using a wiring, which does not extend or contract vertically when elevating or lowering the shielding plate and is arranged to be adjusted in a dimension in the vertical direction by vertically moving a downwardly hung U-shaped portion, that is, a wiring that is not coiled, a required space can be decreased in the vertical direction by using the coiled wiring.

Also, the extension and contraction of the coiled wiring can be guided by the wiring guide. Tipping of the coiled wiring and protrusion of a portion of the wiring in a horizontal direction can thus be prevented. Damage of the bellows due to the wiring contacting the bellows can thereby be prevented. In other words, there is no need to secure a large space inside the bellows for extension and contraction of the wiring. The bellows can thus be made small. The elevating/lowering driving unit and the wiring for the shielding plate can thus be disposed inside the chamber without burdening the housing space inside the chamber.

In the preferred embodiment of the present invention, the substrate processing apparatus includes a fluid supplying nozzle that supplies a fluid to the substrate held by the substrate holding unit, and a nozzle arm that moves the fluid supplying nozzle horizontally. The elevation/lowering driving unit is disposed directly below a horizontal movement range of the nozzle arm.

With the present arrangement, the elevation/lowering driving unit is disposed directly below the horizontal movement range of the nozzle arm. A space below the nozzle arm can thus be utilized to suppress the dimension of the substrate processing apparatus in the vertical direction.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
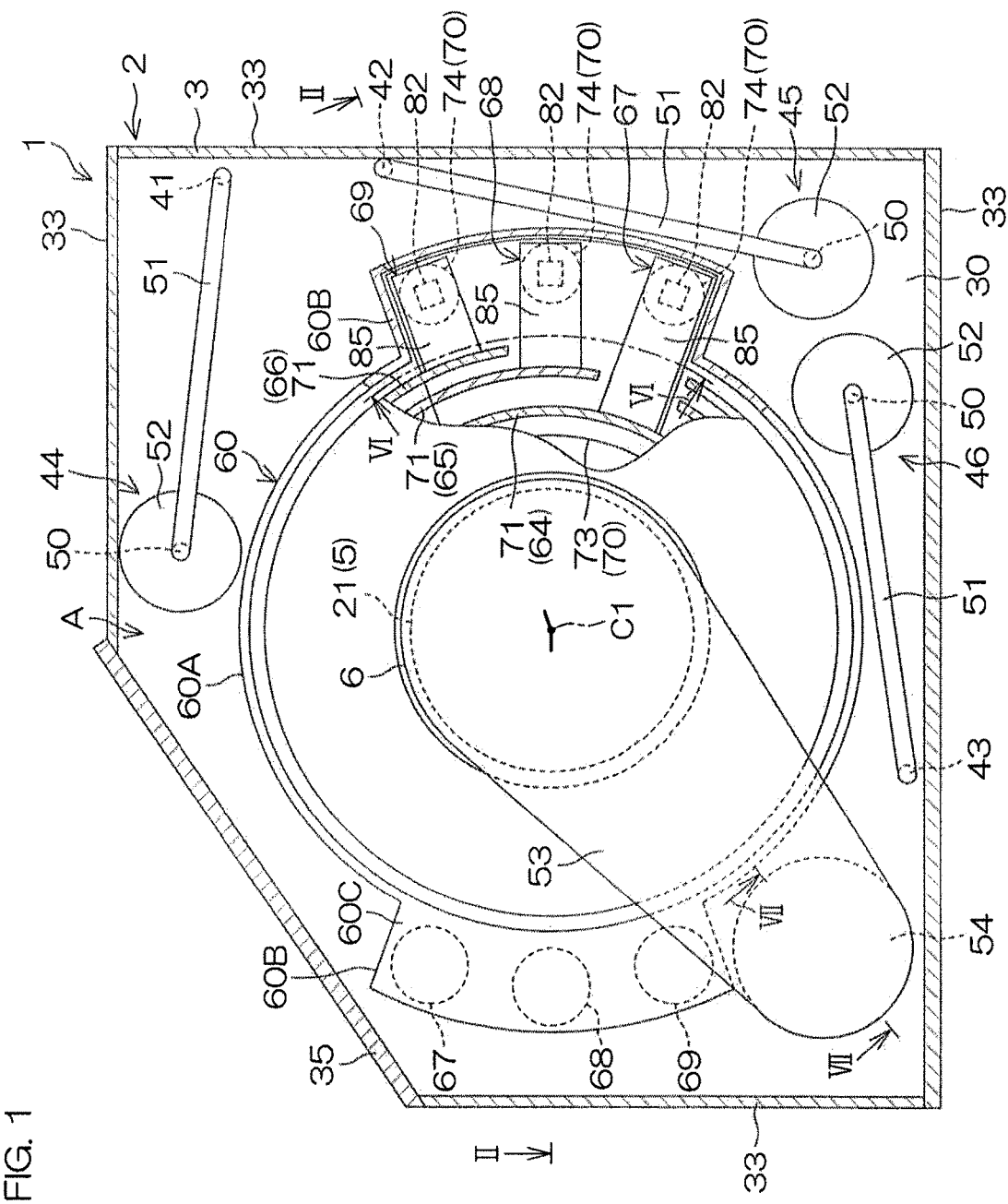
FIG. 1 is a schematic plan view for describing an arrangement example of a processing unit included in a substrate processing system according to a preferred embodiment of the present invention.
Figure 2:
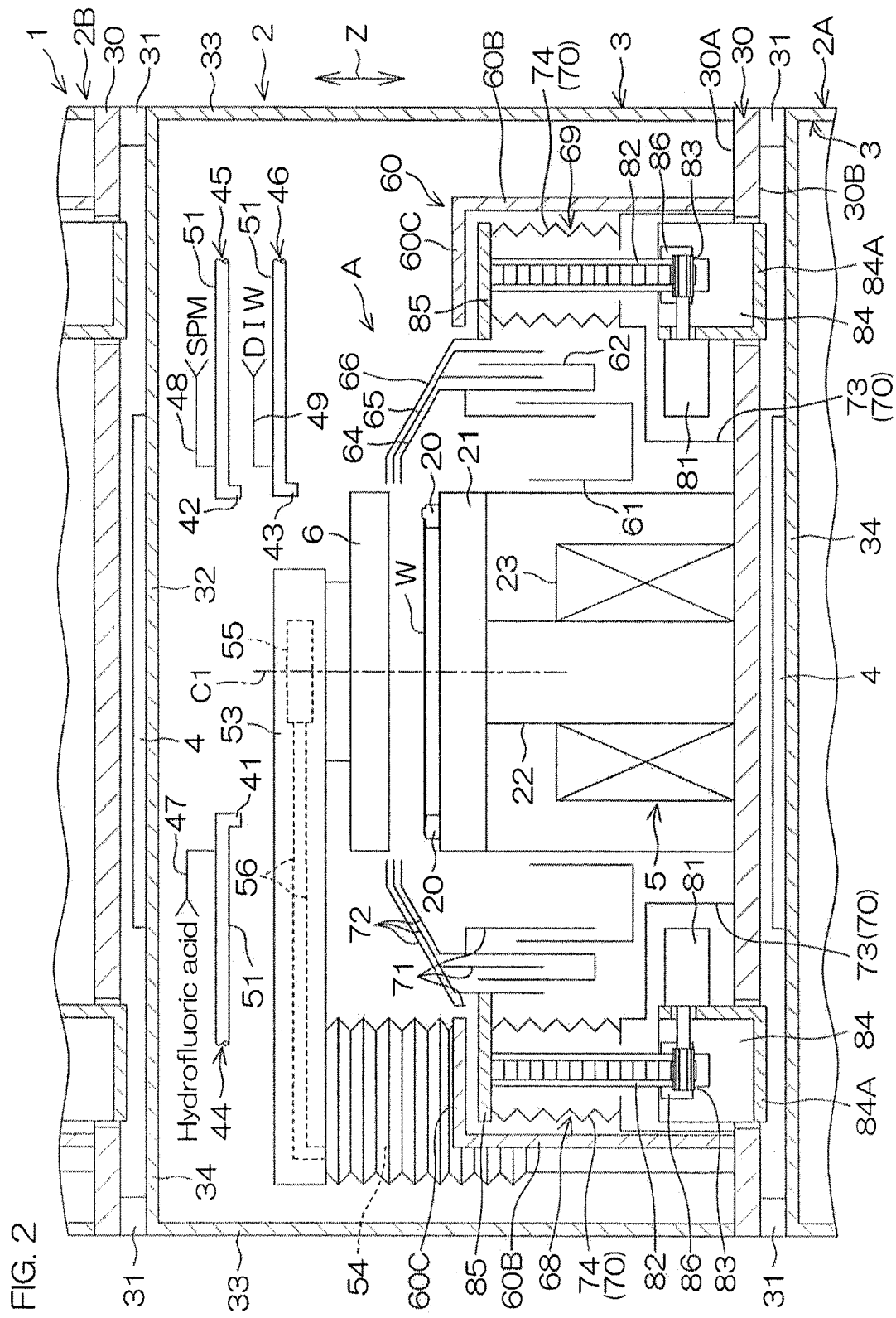
FIG. 2 corresponds to a sectional view taken along line II-II in FIG. 1 and is a schematic view for describing the arrangement example of the processing unit.

FIG. 1 is a schematic plan view for describing an arrangement example of a processing unit 2 included in a substrate processing system 1 according to a preferred embodiment of the present invention. The processing unit 2 is included in a substrate processing apparatus of the present invention. FIG. 2 corresponds to a sectional view taken along line II-II in FIG. 1 and is a schematic view for describing the arrangement example of the processing unit 2.

The substrate processing system 1 is a single substrate processing type apparatus that processes a substrate W, such as a silicon wafer, one by one. The substrate processing system 1 includes a plurality of processing units 2 and a transfer robot (not shown) arranged to carry in and carry out a substrate W to and from each of the plurality of processing units 2. Each processing unit 2 processes a substrate W by a liquid. In the present preferred embodiment, the plurality of processing units 2 are stacked in a vertical direction Z. A processing unit adjoining a processing unit 2 at a center of the sheet of FIG. 2 from below shall be referred to as the processing unit 2A, and a processing unit adjoining a processing unit 2 at the center of the sheet of FIG. 2 from above shall be referred to as the processing unit 2B.

The arrangement of members constituting a single processing unit 2 and mutual positional relationships of the members constituting the single processing unit 2 shall be described below. That is, unless described in particular otherwise, the following description does not describe positional relationships of members constituting a certain processing unit 2 and members constituting a processing unit 2 (another processing unit, such as the processing unit 2A or 2B) other than the certain processing unit 2.

The processing unit 2 includes a substantially rectangular parallelepiped chamber 3, including a base plate 30 having an upper surface 30A that defines a lower side of a housing space A, and a spin chuck 5 that holds a substrate W. The spin chuck 5 is included in a substrate holding unit that holds the substrate W. The substrate holding unit is also called a substrate holder. The spin chuck 5 is housed in the housing space A of the chamber 3 and placed on the upper surface 30A of the base plate 30.

The base plate 30 is, for example, a plate made of aluminum. The chamber 3 includes a plurality (four, in the present preferred embodiment) of side plates 33, extending upward from the base plate 30 and demarcating the housing space A from horizontal directions, a top plate 34, connected to the plurality of side plates 33 and defining the housing space A from above, and a shutter 35, opened and closed when the substrate W is carried into and out by the transfer robot. The shutter 35 is provided with a packing (not shown) that seals intervals with respect to the base plate 30, the adjacent side plates 33, and the top plate 34.

Leg portions 31 are mounted to a lower surface 30B of the base plate 30. The leg portions 31 are the lowest position parts of the processing unit 2. The processing unit 2 is disposed above the processing unit 2A, which is adjacent below the processing unit 2, with the leg portions 31 being made in contact with the top plate 34 of the chamber 3 of the processing unit 2A.

The spin chuck 5 includes a plurality of chuck pins 20 that grip the substrate W, a spin base 21, supporting the plurality of chuck pins 20 and formed to a disk shape along the horizontal directions, a central shaft 22, connected to the spin base 21 and rotating around a vertical rotational axis C1 passing through a center of the substrate W, and a substrate rotation driving unit 23 that rotates the central shaft 22 around the rotational axis C1. The plurality of chuck pins 20 are disposed at intervals in a circumferential direction at a peripheral edge portion of an upper surface of the spin base 21. The substrate rotation driving unit 23 includes, for example, an electric motor, placed on the upper surface 30A of the base plate 30 and applying a rotating force to the central shaft 22 to rotate the chuck pins 20, the spin base 21, and the central shaft 22 integrally around the rotational axis C1.

The processing unit 2 includes an FFU (Fan Filter Unit) 4 that delivers clean air (air filtered by a filter) from above the chamber 3 into the interior thereof. The FFU 4 is mounted onto the top plate 34. The FFU 4 includes the filter (not shown), which filters air inside a clean room in which the substrate processing system 1 is disposed, and a fan (not shown), delivering the air filtered by the filter into the housing space A of the chamber 3. The FFU 4 may include a punching plate (not shown) provided with a plurality of holes at an air outlet thereof. Generation of air vortices inside the housing space A can be prevented thereby.

The processing unit 2 further includes a plurality of nozzles 41 to 43 (first to third nozzles 41 to 43) that supply processing liquids to an upper surface of the substrate W held by the spin chuck 5 and a plurality of nozzle moving units 44 to 46 (first to third nozzle moving units 44 to 46) that move the plurality of nozzles 41 to 43, respectively. The plurality of nozzles 41 to 43 and the plurality of nozzle moving units 44 to 46 are housed in the housing space A of the chamber 3. Although the first nozzle 41 is illustrated in FIG. 2 for convenience of description, the first nozzle 41 actually does not appear in the section shown in FIG. 2. The first nozzle moving unit 44 moves the first nozzle 41. The second nozzle moving unit 45 moves the second nozzle 42. The third nozzle moving unit 46 moves the third nozzle 43.

The processing liquids supplied to the substrate W are fluids for processing a front surface of the substrate W and include, for example, a chemical liquid, such as hydrofluoric acid, a rinse liquid, such as deionized water (DIW), and an organic solvent, such as isopropyl alcohol (IPA).

The chemical liquid is not restricted to hydrofluoric acid and may be a liquid including at least one among sulfuric acid, acetic acid, nitric acid, hydrochloric acid, hydrofluoric acid, ammonia water, hydrogen peroxide water, an organic acid (for example, citric acid, oxalic acid, etc.), an organic alkali (for example, TMAH: tetramethylammonium hydroxide, etc.), a surfactant, a corrosion inhibitor, etc. As examples of a chemical liquid in which the above are mixed, SPM (Sulfuric acid/hydrogen Peroxide Mixture), SC1 (ammonia-hydrogen peroxide mixture), etc., can be cited.

The rinse liquid is not restricted to deionized water and may be any of carbonated water, electrolyzed ion water, hydrogen water, ozone water, and aqueous hydrochloric acid solution of a dilute concentration (of, for example, approximately 10 to 100 ppm).

The organic solvent is not restricted to IPA and may be a liquid including at least one among IPA, HFE (hydrofluoroether), methanol, ethanol, acetone, and trans-1,2 dichloroethylene. Also, the organic solvent is not required to be constituted of only a single component and may be a liquid mixed with another component. For example, the organic solvent may be a mixed liquid of an IPA liquid and pure water or a mixed liquid of an IPA liquid and an HFE liquid.

Each of the nozzles 41 to 43 supplies a processing liquid of different type or concentration. In the present preferred embodiment, the first nozzle 41 is a hydrofluoric acid supplying nozzle that supplies hydrofluoric acid to the upper surface of the substrate W. The second nozzle 42 is an SPM supplying nozzle that supplies SPM to the upper surface of the substrate W. The third nozzle 43 is a DIW supplying nozzle that supplies DIW to the upper surface of the substrate W. The chuck pins 20 of the spin chuck 5 can also be cleaned by the DIW supplying nozzle. The chuck pins 20 can thereby be prevented from becoming contaminated during successive processing of the substrate W.

The fluids supplied from the plurality of nozzles 41 to 43 to the substrate W are not limited to processing liquids and may be inert gases, such as nitrogen.

Individual processing liquid supply pipes 47 to 49 that extends from supply sources of the processing liquids, are connected to the respective nozzles 41 to 43. Each of the plurality of processing liquid supply pipes 47 to 49 has interposed therein an opening/closing valve (not shown) that opens and closes a flow passage thereof.

Each of the nozzle moving units 44 to 46 includes, for example, a pivoting shaft 50, oriented along the vertical direction, a horizontally extending nozzle arm 51, connected to the pivoting shaft 50, and a pivoting shaft driving unit 52, which drives pivoting of the pivoting shaft 50. By the pivoting shaft driving unit 52 making the pivoting shaft 50 pivot around a central axis of the pivoting shaft 50, the nozzle arm 51 is pivoted together with the pivoting shaft 50. Each of the nozzles 41 to 43 is thereby moved between a central position of facing a center of the upper surface of the substrate W and a retracted position of not facing the upper surface of the substrate W in the vertical direction Z.

The processing unit 2 further includes an exhaust bucket 60, surrounding the spin chuck 5, a plurality of cups 61 and 62 (a first cup 61 and a second cup 62), disposed between the spin chuck 5 and the exhaust bucket 60, and a plurality of guards 64 to 66 (first to third guards 64 to 66) receiving processing liquid splashing to a periphery of the substrate W. The exhaust bucket 60, the plurality of cups 61 and 62, and the plurality of guards 64 to 66 are housed in the housing space A.

The processing unit 2 further includes a plurality of guard elevation/lowering driving units 67 to 69 (first to third guard elevation/lowering driving units 67 to 69), which drive elevation and lowering of the plurality of guards 64 to 66, respectively. In the present preferred embodiment, the respective guard elevation/lowering driving units 67 to 69 are provided in pairs so as to be point symmetrical with the rotational axis C1 of the substrate W as a center in plan view. The plurality of guards 64 to 66 can thus be respectively elevated and lowered with stability. With the exception of a portion, the plurality of elevation/lowering driving units 67 to 69 are housed in the housing space A. The plurality of elevation/lowering driving units 67 to 69 are disposed directly below horizontal movement ranges of the nozzle arms 51 of the plurality of nozzles 41 to 43 inside the housing space A.

The plurality of guards 64 to 66 are included in elevated/lowered members capable of being elevated and lowered inside the housing space A. The pair of first elevation/lowering driving units 67 are included in elevation/lowering driving units that drive the elevation and lowering of the first guard 64 as an elevated/lowered member. The pair of second elevation/lowering driving units 68 are included in elevation/lowering driving units that drive the elevation and lowering of the second guard 65 as an elevated/lowered member. The pair of third elevation/lowering driving units 69 are included in elevation/lowering driving units driving the elevation and lowering of the third guard 66 as an elevated/lowered member. The elevation/lowering driving units may also be called lifters.

In the present preferred embodiment, one pair each of the first to third guard elevation/lowering driving units 67 to 69 are provided. However, unlike in the present preferred embodiment, one each of the first to third elevation/lowering driving units 67 to 69 may be provided instead.

The exhaust bucket 60 includes a cylindrical portion 60A of circular cylindrical shape, a plurality (two, in the present preferred embodiment) of projecting portions 60B projecting from the cylindrical portion 60A to a radially outer side of the cylinder portion 60A, and a plurality of lid portions 60C respectively covering the plurality of projecting portions 60B from above. The plurality of guard elevation/lowering driving units 67 to 69 are disposed at the same positions as the projecting portions 60B in a circumferential direction of the cylinder portion 60A but at a further inner side in a rotational radius direction of the substrate W than the projecting portions 60B. In detail, each of a set constituted of a first guard elevation/lowering driving unit 67, a second guard elevation/lowering driving unit 68, and a third guard elevation/lowering driving unit 69 is disposed at the same position as each projecting portion 60B in the circumferential direction.

Each of the cups 61 and 62 is circular cylindrical. Each of the cups 61 and 62 surrounds the spin chuck 5 at a further inner side in the rotational radius direction of the substrate W than the cylindrical portion 60A of the exhaust bucket 60. The second cup 62 is disposed at a further outer side in the rotational radius direction of the substrate W than the first cup 61. The second cup 62 is, for example, integral with the first guard 64 and is elevated and lowered together with the first guard 64. Each of the cups 61 and 62 forms an upwardly-open annular groove.

A recovery piping (not shown) or a waste liquid piping (not shown) is connected to the groove of each of the cups 61 and 62. Processing liquid that has been guided to a bottom portion of each of the cups 61 and 62 is recovered or discarded through the recovery piping or the waste liquid piping.

Each of the guards 64 to 66 is circular cylindrical and surrounds the spin chuck 5 at a further inner side in the rotational radius direction of the substrate W than the cylindrical portion 60A of the exhaust bucket 60. Each of the guards 64 to 66 includes a circular cylindrical guiding portion 71, surrounding a periphery of the spin chuck 5, and a cylindrical inclined portion 72, extending obliquely upward from an upper end of the guiding portion 71 toward a central side (in a direction of approaching the rotational axis C1 of the substrate W).

The three guiding portions 71 are disposed coaxially. The guiding portion 71 of the second guard 65 is disposed at a further outer side in the rotational radius direction of the substrate W than the guiding portion 71 of the first guard 64. The guiding portion 71 of the third guard 66 is disposed at a further outer side in the rotational radius direction of the substrate W than the guiding portion 71 of the second guard 65.

Upper end portions of the respective inclined portions 72 constitute inner peripheral edges of the guards 64 to 66 and have diameters larger than those of the substrate W and the spin base 21. The three inclined portions 72 are overlapped vertically.

The respective guards 64 to 66 are movable between upper positions, at which inner peripheral surfaces of the inclined portions 72 of the respective guards 64 to 66 face a peripheral end surface of the substrate W, and lower positions of being positioned entirely lower than the substrate W. Supplying of a processing liquid to the substrate W and drying of the substrate W are performed in a state where any of the guards 64 to 66 are at the upper position. In detail, processing of the substrate W by a processing liquid is performed in a state where either of the first guard 64 and the second guard 65 is at the upper position. Processing liquid splashing to the circumference of the substrate W when the processing liquid is being supplied to the substrate W is guided by the first guard 64 to the first cup 61 when all guards 64 to 66 are positioned at the upper positions and is guided by the second guard 65 to the second cup 62 when the second guard 65 and the third guard 66 are at the upper positions and the first guard 64 is at the lower position. The drying of the substrate W is performed in a state where only the third guard 66 at the outermost side is positioned at the upper position.

The processing unit 2 further includes a shielding plate 6 that faces, across an interval, the upper surface of the substrate W held by the spin chuck 5, and a shielding plate supporting member 53, connected to the shielding plate 6 and extending horizontally. The processing unit 2 further includes a shielding plate elevation/lowering driving unit 54, which is connected to the shielding plate 6 via the shielding plate supporting member 53 and drives elevation and lowering of the shielding plate 6, and a shielding plate rotation driving unit 55, which rotates the shielding plate 6 around the rotational axis C1. The shielding plate 6, the shielding plate supporting member 53, the shielding plate elevation/lowering driving unit 54, and the shielding plate rotation driving unit 55 are housed in the housing space A. The shielding plate 6 is included in the elevated/lowered members capable of being elevated and lowered inside the housing space A. The shielding plate elevation/lowering driving unit 54 is included in an elevation/lowering driving unit that drives the elevation and lowering of the shielding plate 6 as an elevated/lowered member.

The shielding plate rotation driving unit 55 includes an electric motor incorporated at a tip of the shielding plate supporting member 53. A plurality of wirings 56 disposed inside the shielding plate supporting member 53 are connected to the electric motor. The plurality of wirings 56 include a power line, arranged to transmit power to the electric motor, and an encoder line, arranged to detect rotation information of the shielding plate 6. By detecting the rotation information of the shielding plate 6, the rotation information of the shielding plate 6 can be controlled accurately.

The arrangements of the guard elevation/lowering driving units 67 to 69 shall now be described in detail. In the following, detailed description of the arrangements of the first guard elevation/lowering driving units 67 and the second guard elevation/lowering driving units 68 shall be omitted because, with the exception of cases to be described in particular, the arrangements of the guard elevation/lowering driving units 67 to 69 are the same.

Figure 3:
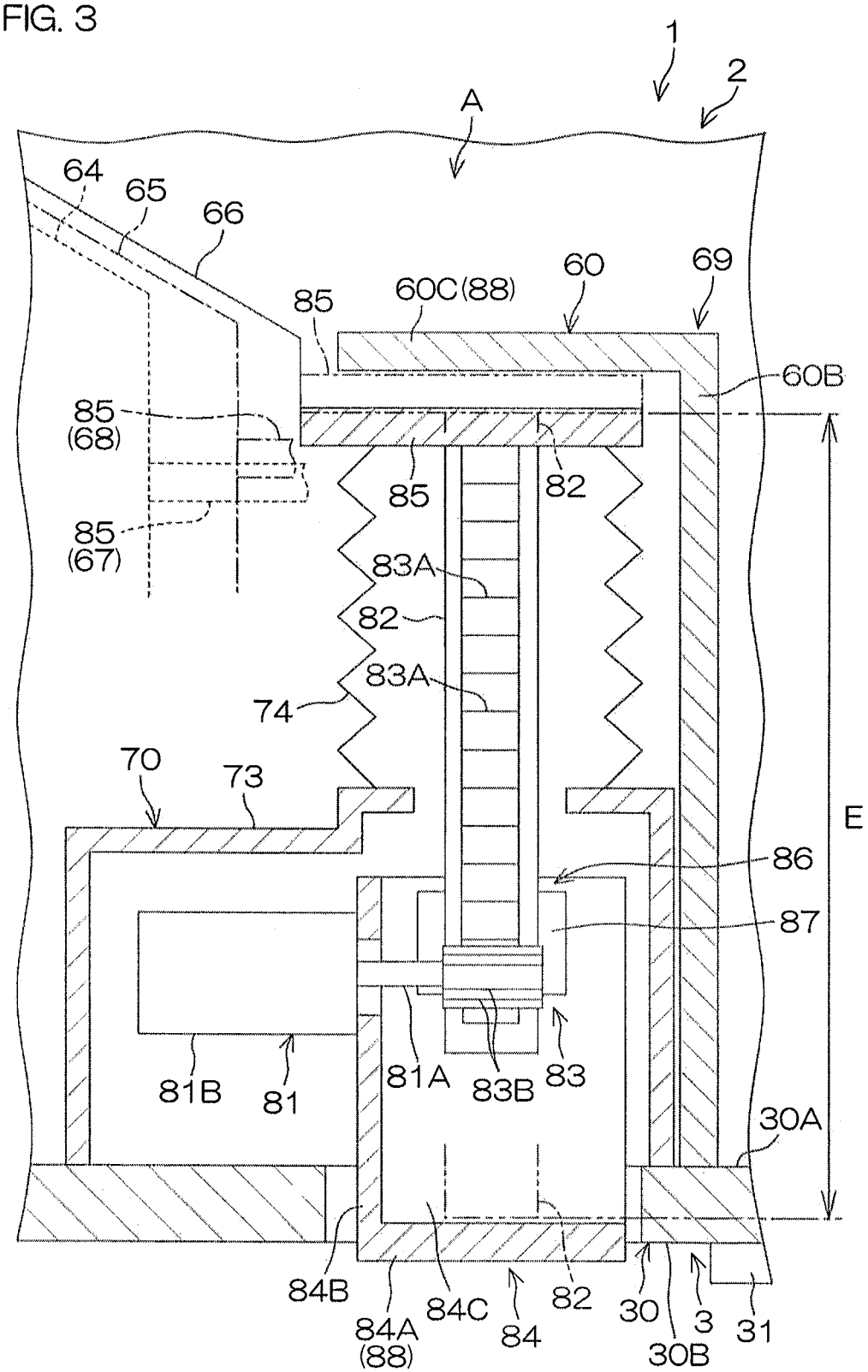
FIG. 3 is an enlarged sectional view of a vicinity of a guard elevation/lowering driving unit.
Figure 4:
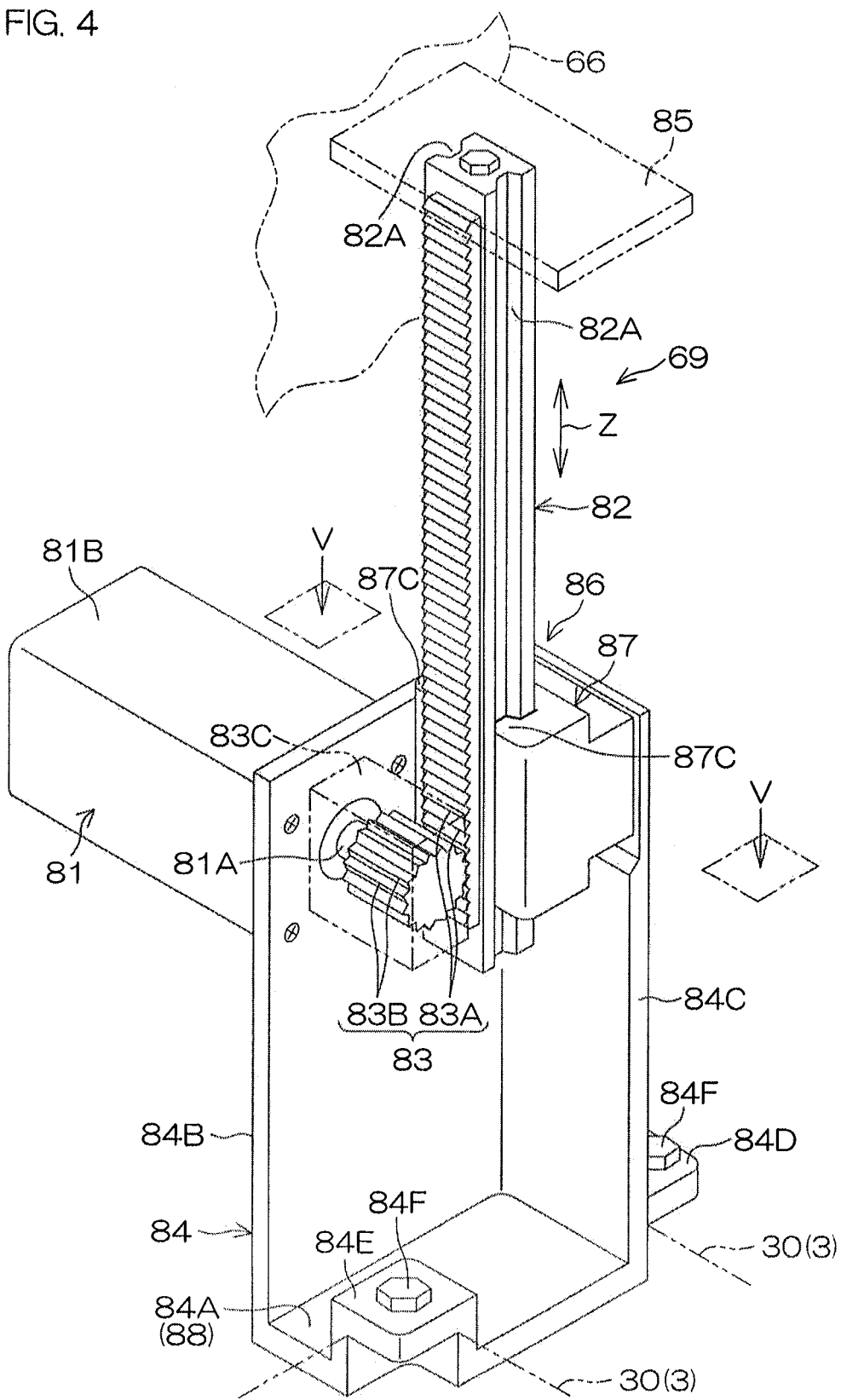
FIG. 4 is a perspective view of a vicinity of the guard elevation/lowering driving unit.
Figure 5:
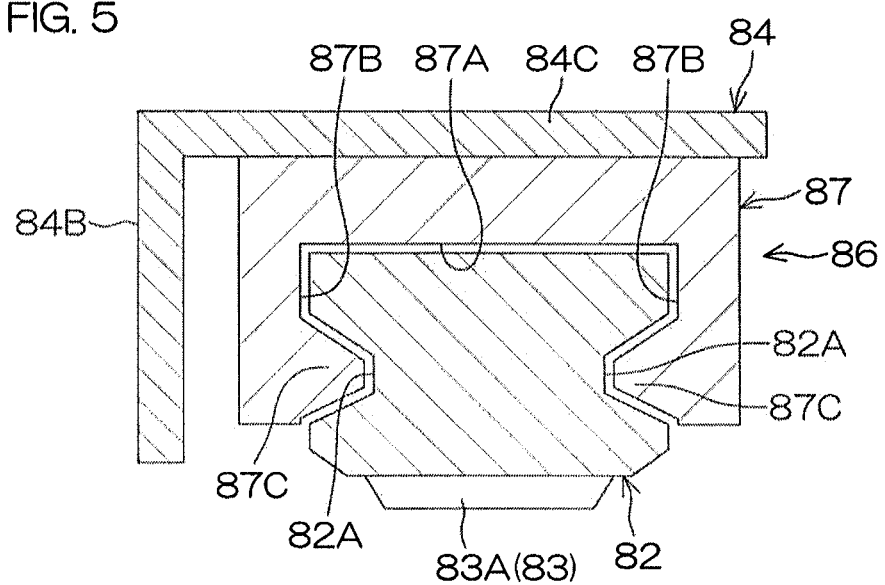
FIG. 5 is a schematic sectional view taken along a plane V-V in FIG. 4.
Figure 6:
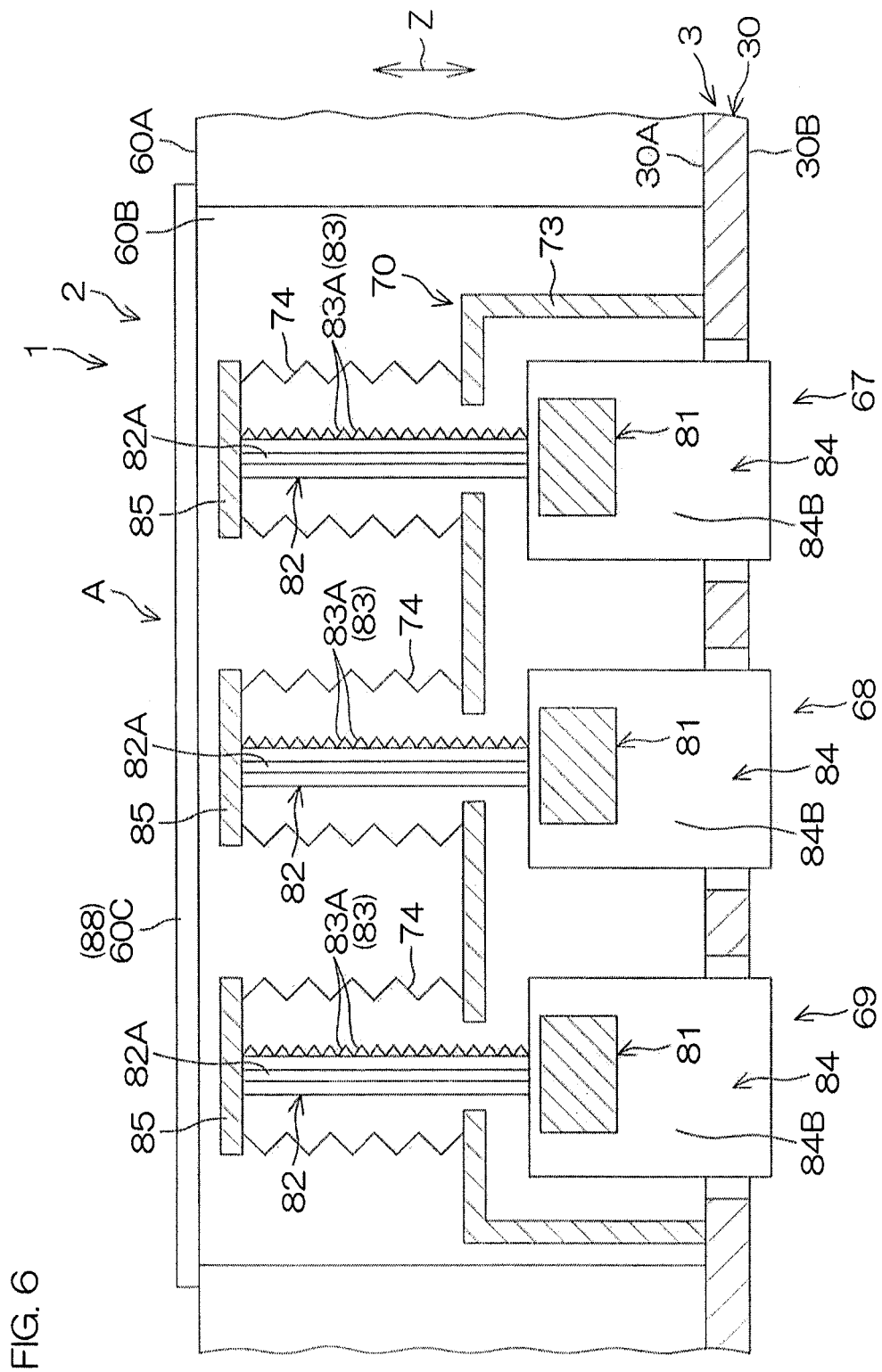
FIG. 6 is a schematic sectional view taken along line VI-VI in FIG. 1.

FIG. 3 is an enlarged sectional view of a vicinity of a third guard elevation/lowering driving unit 69. Portions of the first guard 64 and a first guard elevation/lowering driving unit 67 are illustrated by broken lines in FIG. 3. Portions of the second guard 65 and a second guard elevation/lowering driving unit 68 are illustrated by alternate long and short dashes lines in FIG. 3. FIG. 4 is a perspective view of a vicinity of the third guard elevation/lowering driving unit 69. FIG. 5 is a schematic sectional view taken along a plane V-V in FIG. 4. FIG. 6 is a schematic sectional view taken along line VI-VI in FIG. 1.

The third guard elevation/lowering driving unit 69 includes a first driving source 81 and a first elevating/lowering head 82 that is disposed at a side of the third guard 66 and is moved vertically, together with the third guard 66, within a predetermined movable range E by the first driving source 81. The first driving source 81 includes a horizontally extending rotating shaft 81A. The third guard elevation/lowering driving unit 69 further includes a first rotation transmitting unit 83 that transmits the rotation of the rotating shaft 81A to the first elevating/lowering head 82 to move the first elevating/lowering head 82 vertically. The third guard elevation/lowering driving unit 69 further includes a first guiding unit 86 that guides the vertical movement of the first elevating/lowering head 82, a bracket 84 that supports the first driving source 81 and the first elevating/lowering head 82, and a connecting member 85, connecting the first elevating/lowering head 82 and the third guard 66. The third guard elevation/lowering driving unit 69 further includes a first restricting unit 88 that restricts the vertical movement of the first elevating/lowering head 82 to be within the predetermined movable range E.

A first elevating/lowering head 82 of the first guard elevation/lowering driving unit 67 is disposed at a side of the first guard 64 (see FIG. 1) and is connected via a connecting member 85 to the first guard 64. The first elevating/lowering head 82 of the first guard elevation/lowering driving unit 67 is capable of moving vertically, together with the first guard 64, within the predetermined movable range E.

A first elevating/lowering head 82 of the second guard elevation/lowering driving unit 68 is disposed at a side of the second guard 65 (see FIG. 1) and is connected via a connecting member 85 to the second guard 65. The first elevating/lowering head 82 of the second guard elevation/lowering driving unit 68 is capable of moving vertically, together with the second guard 65, within the predetermined movable range E.

The bracket 84 includes a horizontally extending bottom plate 84A, a first side plate 84B, extending upward from an upper surface of the bottom plate 84A, and a second side plate 84C, extending upward from the upper surface of the bottom plate 84A and connected to the first side plate 84B.

The bracket 84 is fixed to the base plate 30 in a state of being inserted through a penetrating hole formed in the base plate 30. the second side plate 84C is connected a first fixing portion 84D that projects horizontally to a side opposite the bottom plate 84A side. A second fixing portion 84E, disposed higher than the bottom plate 84A, is connected via a step to the bottom plate 84A. A bolt 84F is inserted through each of the first fixing portion 84D and the second fixing portion 84E. The bracket 84 is thereby fixed to the base plate 30.

The bracket 84 is disposed so that its entirety is positioned at least higher than lower ends of the leg portions 31 of the chamber 3. The bottom plate 84A is disposed so that its upper surface is positioned higher than the lower surface 30B of the base plate 30.

The first driving source 81 is housed in the housing space A of the chamber 3. The first driving source 81 is disposed higher than the lower surface 30B of the base plate 30.

The first driving source 81 further includes a driving motor 81B as a rotation driving source that rotates the horizontally extending rotating shaft 81A. The driving motor 81B has a motor housing of substantially rectangular parallelepiped shape. The first driving source 81 may include a speed reducer (not shown) arranged to decelerate the rotation of the rotating shaft 81A by the driving motor 81B and an encoder (not shown) arranged to detect rotation information of the driving motor 81B.

The rotating shaft 81A of the first driving source 81 is supported by the driving motor 81B. The rotating shaft 81A is inserted through an insertion hole provided in the first side plate 84B. A tip of the rotating shaft 81A is positioned above the bottom plate 84A. The driving motor 81B is fixed to the first side plate 84B, for example, by a plurality of screws so that its length direction (which is also the direction in which the rotating shaft 81A extends) is directed horizontally. An entirety of the driving motor 81B is thereby positioned higher than the lower surface 30B of the base plate 30.

The first guiding unit 86 includes a first guide member 87 fixed to the chamber 3. In detail, the first guide member 87 is fixed to an upper end portion of the second side plate 84C of the bracket 84 that is fixed to the base plate 30 of the chamber 3. As shown in FIG. 5, the first guide member 87 has formed therein a recess 87A that notches the first guide member 87 from a side opposite the second side plate 84C side. A projecting rib 87C, extending in the vertical direction Z, is formed on each of facing surfaces 87B that face each other so as to define the recess 87A.

In the present preferred embodiment, the first elevating/lowering head 82 has a square column shape extending in the vertical direction Z. The first elevating/lowering head 82 is recess-projection engaged slidably with the first guide member 87 fixed to the second side plate 84C and is supported by the bracket 84 via the first guide member 87. In detail, the first elevating/lowering head 82 is fitted into the recess 87A. Also, a recessed groove 82A, extending in the vertical direction Z, is formed in each of surfaces of the first elevating/lowering head 82 that face the facing surfaces 87B of the first guide member 87. The pair of projecting ribs 87C engage respectively with the pair of recessed grooves 82A. Vertical movement of the first elevating/lowering head 82 is thus guided by the first guide member 87. The first guide member 87 thus functions as a linear block and the first elevating/lowering head 82 functions as a linear guide. Unlike in the present preferred embodiment, recessed grooves may be formed in the first guide member 87 and projections may be formed in the first elevating/lowering head 82. The first elevating/lowering head 82 is thereby recess-projection engaged slidably with the first guide member 87.

The connecting member 85 is fixed by a screw, etc., to an upper end of the first elevating/lowering head 82. The connecting member 85 faces a lid portion 60C of the exhaust bucket 60 from below.

The first rotation transmitting unit 83 includes a plurality of rack teeth 83A, formed on the first elevating/lowering head 82, and a plurality of pinion teeth 83B, which are engaged with the rack teeth 83A and to which the rotation of the rotating shaft 81A is transmitted. The plurality of rack teeth 83A are aligned vertically at a surface of the first elevating/lowering head 82 at a side opposite a surface at the second side plate 84C side. Each rack tooth 83A has a tooth trace that extends substantially horizontally. The plurality of pinion teeth 83B are formed at the tip of the rotating shaft 81A. The plurality of pinion teeth 83B are aligned in a circumferential direction of the rotating shaft 81A. The pinion teeth 83B face the rack teeth 83A from a side opposite the second side plate 84C. Positions of the pinion teeth 83B in the vertical direction Z overlap at least partially with the first guide member 87. The pinion teeth 83B may be covered, in a state of being engageable with the rack teeth 83A, by a case 83C fixed to the bracket 84 (see FIG. 4).

The first restricting unit 88 includes the bottom plate 84A as a lower end position restricting member, restricting a lower end position of the movable range E of the first elevating/lowering head 82, and the lid portion 60C as an upper end position restricting member, restricting an upper end position of the movable range E of the first elevating/lowering head 82. The lower end position of the movable range E of the first elevating/lowering head 82 is a position (position indicated by an alternate long and two short dashes line at a lower side of the sheet of FIG. 3) of a lower end of the first elevating/lowering head 82 when the first elevating/lowering head 82 is lowered and its lower end contacts the bottom plate 84A. The upper end position of the movable range E of the first elevating/lowering head 82 is a position (position indicated by an alternate long and two short dashes line at an upper side of the sheet of FIG. 3) of the upper end of the first elevating/lowering head 82 when the first elevating/lowering head 82 is elevated and the connecting member 85 connected to the upper end contacts the lid portion 60C of the exhaust bucket 60.

The upper surface of the bottom plate 84A that is a lower end position restricting portion is positioned higher than the lower surface 30B of the base plate 30. The lower end position of the movable range E of the first elevating/lowering head 82 is thereby positioned higher than the lower surface 30B of the base plate 30. The entire movable range E of the first elevating/lowering head 82 is thus positioned higher than the lower surface 30B of the base plate 30. The first driving source 81 is not juxtaposed to the first elevating/lowering head 82 in the vertical direction Z but its entirety is disposed at a side of the movable range E of the first elevating/lowering head 82.

Operations of the guard elevation/lowering driving units 67 to 69 shall now be described.

When the driving motor 81B of the first driving source 81 rotates the rotating shaft 81A, the pinion teeth 83B at the tip of the rotating shaft 81A rotate. The rotation of the pinion teeth 83B is transmitted via the rack teeth 83A to the first elevating/lowering head 82 and is converted to a rectilinear motion of the first elevating/lowering head 82 in the vertical direction Z. The first elevating/lowering head 82 is thereby moved vertically. The rack teeth 83A and the pinion teeth 83B are thus also a motion converting unit that converts the rotation of the rotating shaft 81A to the vertical movement of the first elevating/lowering head 82. The vertical movement of the first elevating/lowering head 82 is guided by the first guide member 87 of the first guiding unit 86.

At the third guard elevation/lowering driving unit 69, the third guard 66 is elevated or lowered in accordance with the vertical movement of the first elevating/lowering head 82. At the third guard elevation/lowering driving unit 69, when the driving motor 81B of the first driving source 81 stops the rotation of the rotating shaft 81A, the vertical movement of the rack teeth 83A, engaging with the pinion teeth 83B, is stopped. The elevation or lowering of the third guard 66 is thereby stopped.

Similarly, at the first guard elevation/lowering driving unit 67, the first guard 64 is elevated or lowered in accordance with the vertical movement of the first elevating/lowering head 82. At the first guard elevation/lowering driving unit 67, when the driving motor 81B of the first driving source 81 stops the rotation of the rotating shaft 81A, the vertical movement of the rack teeth 83A, engaging with the pinion teeth 83B, is stopped. The elevation or lowering of the first guard 64 is thereby stopped.

Similarly, at the second guard elevation/lowering driving unit 68, the second guard 65 is elevated or lowered in accordance with the vertical movement of the first elevating/lowering head 82. At the second guard elevation/lowering driving unit 68, when the driving motor 81B of the first driving source 81 stops the rotation of the rotating shaft 81A, the vertical movement of the rack teeth 83A, engaging with the pinion teeth 83B, is stopped. The elevation or lowering of the second guard 65 is thereby stopped.

Referring to FIG. 6, the processing unit 2 includes first isolating members 70, each housing a plurality of guard elevation/lowering driving units 67 to 69 and isolating the plurality of guard elevation/lowering driving units 67 to 69 from an atmosphere of the housing space A inside the chamber 3. Each first isolating member 70 includes a housing 73, fixed to the upper surface 30A of the base plate 30, and a plurality of bellows 74, which are provided between the housing 73 and the connecting members 85 of the respective guard elevation/lowering driving units 67 to 69 and are extensible and contractible vertically.

The housing 73 houses the first driving sources 81 and lower side portions of the first elevating/lowering heads 82 of the plurality of guard elevation/lowering driving units 67 to 69.

The bellows 74 are made, for example, of Teflon (registered trademark). The plurality of bellows 74 respectively house upper side portions of the plurality of first elevating/lowering heads 82. The plurality of bellows 74 respectively extend or contract in the vertical direction Z when the plurality of connecting members 85 move vertically in accordance with the vertical movements of the plurality of first elevating/lowering heads 82.

With the present arrangement, the first to third guard elevation/lowering driving units 67 to 69 drive the elevation and lowering of the first to third guards 64 to 66. In each of the first to third guard elevation/lowering driving units 67 to 69, even when the first elevating/lowering head 82 is positioned at the lowest side of the movable range E, the first driving source 81 and the first elevating/lowering head 82 are disposed higher than the lower surface 30B of the base plate 30. A dimension of the processing unit 2 in the vertical direction Z can thus be suppressed in comparison to an arrangement where the first driving source 81 and the first elevating/lowering head 82 are disposed lower than the lower surface 30B of the base plate 30. A plurality of processing units 2 can thereby be disposed in proximity in the vertical direction Z. A dimension of an entirety of the substrate processing system 1 in the vertical direction Z can thus be suppressed as well and the number of processing units 2 that can be installed in the substrate processing system 1 can also be increased.

Also, the first driving sources 81 are housed in the housing space A of the chamber 3. Dimensions of the processing unit 2 in the vertical direction Z and the horizontal directions can thus be suppressed.

Also, the entirety of each first driving source 81 is disposed at the side of the movable range E of the corresponding first elevating/lowering head 82. Therefore, by juxtaposing the first driving source 81 and the first elevating/lowering head 82 in the horizontal direction, the dimension of each of the first to third elevation/lowering driving units 67 to 69 in the vertical direction Z can be suppressed. The dimension of the substrate processing apparatus 2 in the vertical direction Z can thus be suppressed further.

Also, each first elevating/lowering head 82 can be moved vertically by transmitting the rotation of the corresponding horizontally extending rotating shaft 81A to the first elevating/lowering head 82. Therefore, even when the first driving source 81 that is long in an axial direction of the rotating shaft 81A is used, the dimension of each of the first to third elevation/lowering driving units 67 to 69 in the vertical direction Z can be suppressed.

Also, the rotation of the rotating shaft 81A, disposed at a side of the first elevating/lowering head 82, can be transmitted to the first elevating/lowering head 82 by a simple arrangement that includes the mutually engaging rack teeth 83A and pinion teeth 83B. It is thus easy to dispose the entirety of the first driving source 81 at the side of the movable range E of the first elevating/lowering head 82. The dimension of each of the first to third elevation/lowering driving units 67 to 69 in the vertical direction Z can thus be suppressed even further.

Also, the vertical movement of each first elevating/lowering head 82 is guided by the corresponding first guiding unit 86. The first elevating/lowering head 82 can thus be moved vertically accurately and with stability. A distance between the first elevating/lowering head 82 and another member (the bracket 84, the first driving source 81, etc.) can thus be shortened.

Also, the vertical movement of each first elevating/lowering head 82 can be guided by a simple arrangement in which the first elevating/lowering head 82 and the first guide member 87 are recess-projection engaged. The dimension of each of the first to third elevation/lowering driving units 67 to 69 in the vertical direction Z can thus be suppressed even further.

Also, the first to third elevation/lowering driving units 67 to 69 are isolated from the atmosphere inside the housing space A inside the chamber 3 by the first isolating members 70. The first driving sources 81 and the first elevating/lowering heads 82 can thus be disposed higher than the lower surface 30B of the base plate 30 regardless of amount or type of substance that splashes or scatters in the atmosphere inside the housing space A.

Also, the first to third elevation/lowering driving units 67 to 69 are disposed directly below the horizontal movement ranges of the nozzle arms 51. A space below the nozzle arms 51 can thus be utilized to suppress the dimension of the processing unit 2 in the vertical direction Z.

The arrangement of the shielding plate elevation/lowering driving unit 54 shall now be described in detail.

Figure 7:
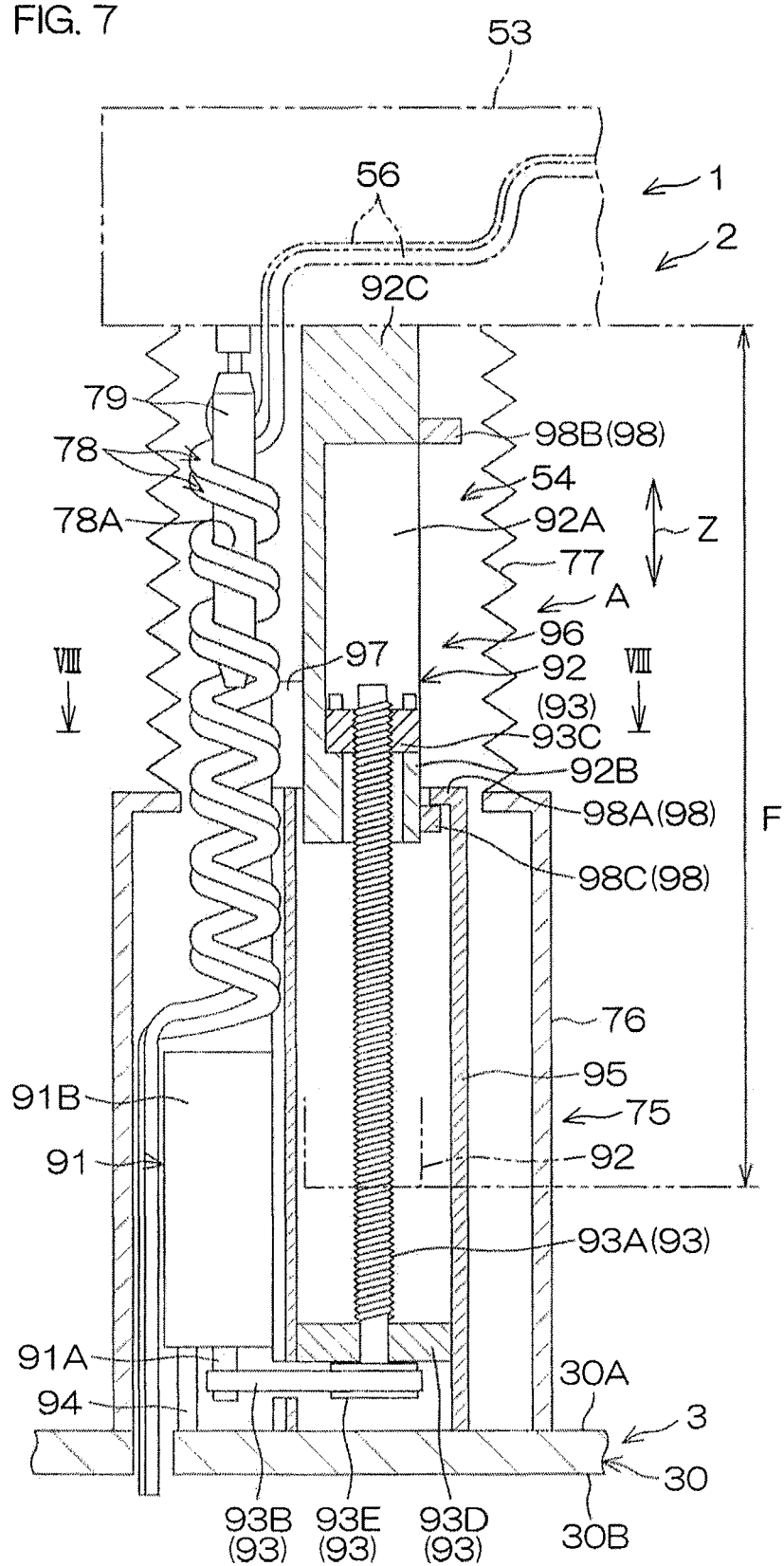
FIG. 7 is a schematic sectional view taken along line VII-VII in FIG. 1.
Figure 8:
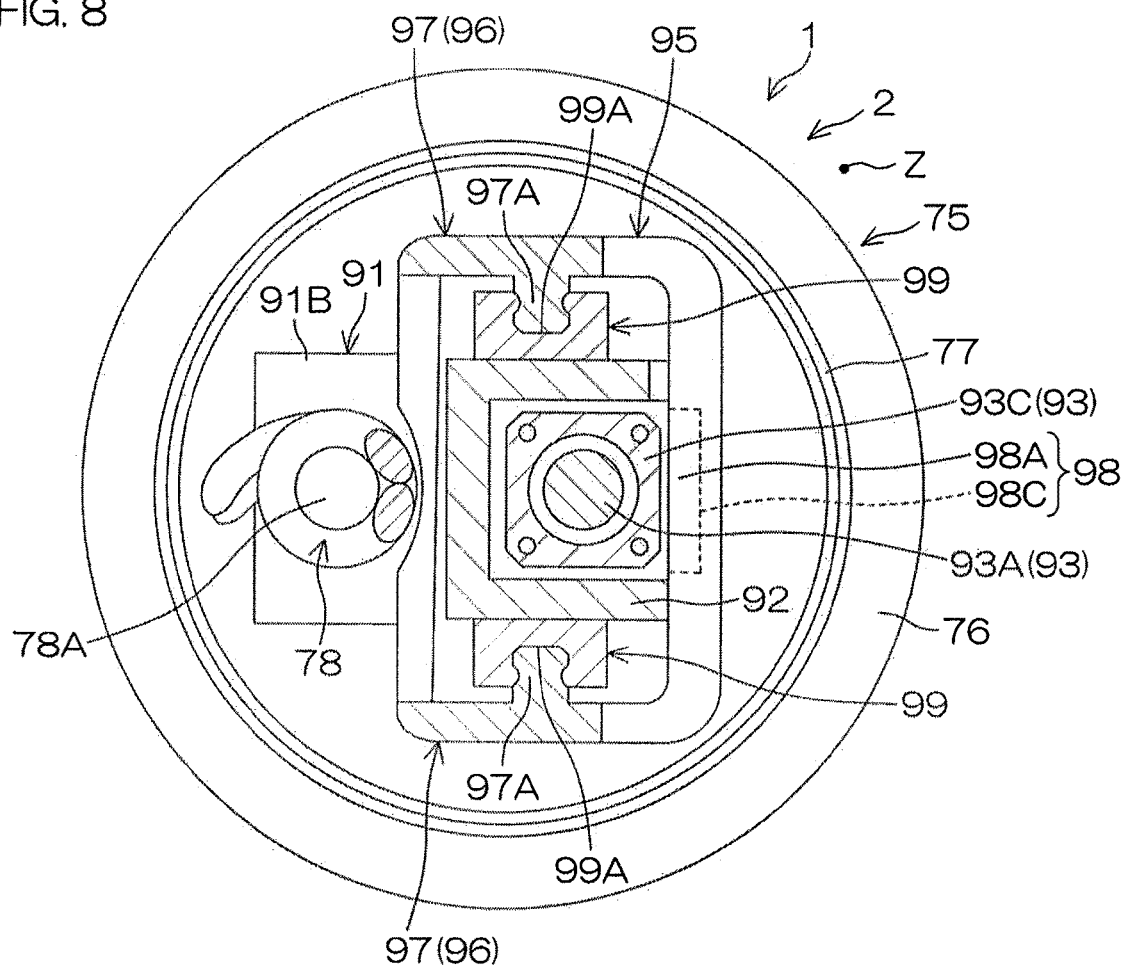
FIG. 8 is a schematic sectional view taken along line VIII-VIII in FIG. 7.

FIG. 7 is a schematic sectional view taken along line VII-VII in FIG. 1. FIG. 8 is a schematic sectional view taken along line VIII-VIII in FIG. 7.

The shielding plate elevation/lowering driving unit 54 includes a second driving source 91 and a second elevating/lowering head 92, disposed at a side of the shielding plate 6 and moved vertically, together with the shielding plate 6, within a predetermined movable range F by the second driving source 91. The second driving source 91 includes a vertically extending rotating shaft 91A. The shielding plate elevation/lowering driving unit 54 further includes a second rotation transmitting unit 93 that transmits the rotation of the rotating shaft 91A to the second elevating/lowering head 92 to move the second elevating/lowering head 92 vertically. The shielding plate elevation/lowering driving unit 54 further includes a second guiding unit 96 that guides the vertical movement of the second elevating/lowering head 92, a first bracket 94, supporting the second driving source 91, and a second bracket 95, supporting the second elevating/lowering head 92. The shielding plate elevation/lowering driving unit 54 further includes a second restricting unit 98, restricting the vertical movement of the second elevating/lowering head 92 to be within the predetermined movable range F.

The second driving source 91 is disposed inside the housing space A. The second driving source 91 is disposed higher than the lower surface 30B of the base plate 30. The second driving source 91 further includes a driving motor 91B as a rotation driving source that rotates the vertically extending rotating shaft 91A. The driving motor 91B includes a motor housing of substantially rectangular parallelepiped shape. The driving motor 91B is fixed by the first bracket 94, extending upward from the upper surface 30A of the base plate 30, so that its length direction is directed vertically. The second driving source 91 may include a speed reducer (not shown) arranged to decelerate the rotation of the rotating shaft 91A by the driving motor 91B and an encoder (not shown) arranged to detect a rotational speed of the driving motor 91B.

The rotating shaft 91A of the second driving source 91 is supported by the driving motor 91B. The rotating shaft 91A extends downward from a lower end of the driving motor 91B. A tip of the rotating shaft 91A is disposed above the base plate 30.

The second bracket 95 has a substantially rectangular cylindrical shape that extends upward from the upper surface 30A of the base plate 30. An entirety of the second bracket 95 is disposed higher than the lower surface 30B of the base plate 30.

The second guiding unit 96 includes a pair of second guide members 97 fixed to the second bracket 95. Each of the pair of second guide members 97 has a plate shape extending upward from an upper end of the second bracket 95. The pair of second guide members 97 face each other. The pair of second guide members 97 respectively have formed thereon projecting ribs 97A projecting so as to approach each other. Each projecting rib 97A has a strip shape extending in the vertical direction Z.

The second elevating/lowering head 92 has a square column shape extending in the vertical direction Z and is disposed at a side of the second driving source 91. The second elevating/lowering head 92 has a recess 92A formed therein that notches the second elevating/lowering head 92 from a side opposite the second driving source 91 side to the second driving source 91 side. The second elevating/lowering head 92 has a lower plate portion 92B defining the recess 92A from below and an upper plate portion 92C defining the recess 92A from above.

The second elevating/lowering head 92 is recess-projection engaged slidably by the pair of second guide members 97 fixed to the second bracket 95 and is thereby supported by the second elevating/lowering head 92 via the pair of second guide members 97. In detail, the second elevating/lowering head 92 includes a pair of engaging members 99, connected to surfaces at both sides of the second driving source 91 side surface of the second bracket 95 and an engaged with the second guide members 97. Each engaging member 99 has formed therein a recessed groove 99A, extending in the vertical direction Z. The projecting ribs 97A engage respectively with the pair of recessed grooves 99A. Unlike in the present preferred embodiment, projections may be formed in the engaging members 99 and recessed grooves may be formed in the second guide members 97. The second elevating/lowering head 92 is thereby recess-projection engaged slidably with the second guide members 97.

The second rotation transmitting unit 93 includes a vertically extending thread shaft 93A, a transmission belt 93B that transmits the rotation of the rotating shaft 91A to the thread shaft 93A, and a nut 93C, fixed to the second elevating/lowering head 92 and screwed onto the thread shaft 93A.

The thread shaft 93A is, for example, rotatably supported by the second bracket 95 via a bearing 93D. The thread shaft 93A is inserted through an insertion hole provided in the lower plate portion 92B and a tip thereof is positioned inside the recess 92A of the second elevating/lowering head 92. The transmission belt 93B is stretched across a lower end of the rotating shaft 91A and a pulley 93E mounted to a lower end of the thread shaft 93A. The nut 93C is housed inside the recess 92A and is fixed by a screw, etc., to the lower plate portion 92B.

The second restricting unit 98 includes a contacted member 98A, fixed to the chamber 3, a first contacting member 98B, fixed to the second elevating/lowering head 92 and facing the contacted member 98A from above, and a second contacting member 98C, fixed to the second elevating/lowering head 92 and facing the contacted member 98A from below. The contacted member 98A is, for example, fixed to the upper end of the second bracket 95.

A lower end position of the movable range F of the second elevating/lowering head 92 is a position of a lower end of the second elevating/lowering head 92 when the contacted member 98A and the first contacting member 98B come in contact (see the second elevating/lowering head 92 indicated by alternate long and two short dashes lines in FIG. 7). An upper end position of the movable range F of the second elevating/lowering head 92 is a position of an upper end of the second elevating/lowering head 92 when the contacted member 98A and the second contacting member 98C come in contact (see the second elevating/lowering head 92 indicated by solid lines in FIG. 7). The second driving source 91 is not juxtaposed to the second elevating/lowering head 92 in the vertical direction Z but its entirety is disposed at a side of the movable range F of the second elevating/lowering head 92.

Operations of the shielding plate elevation/lowering driving unit 54 shall now be described.

When the driving motor 91B of the second driving source 91 rotates the rotating shaft 91A, the transmission belt 93B rotates around the rotating shaft 91A and the pulley 93E and rotates the thread shaft 93A via the pulley 93E. The rotation of the rotating shaft 91A is converted to a rectilinear motion in the vertical direction Z of the second elevating/lowering head 92, to which the nut 93C that is screwed onto the thread shaft 93A, is fixed. The second elevating/lowering head 92 is thereby moved vertically. The second elevating/lowering head 92 is recess-projection engaged slidably with the pair of second guide members 97 and therefore the second elevating/lowering head 92 is guided in the vertical direction Z by the pair of second guide members 97 without rotating.

When the driving motor 91B of the second driving source 91 stops the rotation of the rotating shaft 91A, the vertical movement of the nut 93C screwed onto the thread shaft 93A is stopped and therefore the elevation or lowering of the shielding plate 6 (see FIG. 2) is stopped.

The processing unit 2 further includes a second isolating member 75, housing the shielding plate elevation/lowering driving unit 54 and isolating the shielding plate elevation/lowering driving unit 54 from the atmosphere inside the housing space A of the chamber 4. The second isolating member 75 includes a housing 76, fixed to the upper surface 30A of the base plate 30, and a bellows 77 that is provided between the housing 76 and the shielding plate supporting member 53 and is extensible and contractible vertically.

The housing 76 houses the second driving source 91 and a lower side portion of the second elevating/lowering head 92. The bellows 77 is made, for example, of Teflon (registered trademark). The bellows 77 houses an upper side portion of the second elevating/lowering head 92. The bellows 77 extends and contracts in the vertical direction Z when the shielding plate supporting member 53 moves vertically in accordance with the vertical movement of the second elevating/lowering head 92.

The processing unit 2 includes a plurality of coiled wirings 78, which are extensible and contractible vertically and are electrically connected to the shielding plate 6 via the plurality of wirings 56, and a wiring guide 79, which is elevated and lowered together with the shielding plate 6 and guides the extension and contraction of the plurality of wirings 78. The plurality of wirings 78 and the wiring guide 79 are housed inside the bellows 77. The same number of the plurality of wirings 78 are provided as the wirings 56. A single wiring 56 is connected respectively to each wiring 78. As a whole, the plurality of wirings 78 form a cylindrical shape extending in the vertical direction Z. The plurality of wirings 78 define a circular cylindrical space 78A extending in the vertical direction Z. The wiring guide 79 has an axial shape extending downward from the shielding plate supporting member 53. The wiring guide 79 is inserted through the circular cylindrical space 78A defined by the plurality of coiled wirings 78.

When the shielding plate 6 is lowered together with the second elevating/lowering head 92, the coiled wirings 78 contract in the vertical direction Z by narrowing a pitch in the vertical direction Z while being guided by the wiring guide 79 that is lowered in the space 78A. Oppositely, when the shielding plate 6 is elevated together with the second elevating/lowering head 92, the coiled wirings 78 extend in the vertical direction Z by widening the pitch in the vertical direction Z while being guided by the wiring guide 79 that is elevated in the cylindrical space 78A.

With the present arrangement, the shielding plate elevation/lowering driving unit 54 drives the elevation and lowering of the shielding plate 6. In the shielding plate elevation/lowering driving unit 54, even when the second elevating/lowering head 92 is positioned at the lowest side of the movable range F, the second driving source 91 and the second elevating/lowering head 92 are disposed higher than the lower surface 30B of the base plate 30. A dimension of the processing unit 2 in the vertical direction Z can thus be suppressed in comparison to an arrangement where the second driving source 91 and the second elevating/lowering head 92 are disposed lower than the lower surface 30B of the base plate 30. A plurality of processing units 2 can thereby be disposed in proximity in the vertical direction Z. The dimension of the entirety of the substrate processing system 1 in the vertical direction Z can thus be suppressed as well and the number of processing units 2 that can be installed in the substrate processing system 1 can also be increased.

Also, the second driving source 91 is housed in the housing space A of the chamber 3. The dimensions of the processing unit 2 in the vertical direction Z and the horizontal directions can thus be suppressed.

Also, the entirety of the second driving source 91 is disposed at the side of the movable range F of the second elevating/lowering head 92. Therefore, by juxtaposing the second driving source 91 and the second elevating/lowering head 92 in the horizontal direction, the dimension of the shielding plate elevation/lowering driving unit 54 in the vertical direction Z can be suppressed. The dimension of the substrate processing apparatus 2 in the vertical direction Z can thus be suppressed further.

Also, the second elevating/lowering head 92 can be moved vertically by transmitting the rotation of the vertically extending rotating shaft 91A to the second elevating/lowering head 92. The dimension of the shielding plate elevation/lowering driving unit 54 in the vertical direction Z can thus be suppressed while disposing the second driving source 91 with the axial direction of the rotating shaft 91A being directed vertically.

Also, the rotation of the rotating shaft 91A can be transmitted to the second elevating/lowering head 92 by the second rotation transmitting unit 93 of a simple arrangement that includes the thread shaft 93A and the nut 93C screwed thereonto. The dimension of the shielding plate elevation/lowering driving unit 54 in the vertical direction Z can thus be suppressed even further.

Also, the vertical movement of the second elevating/lowering head 92 is guided by the second guiding unit 96. The second elevating/lowering head 92 can thus be moved vertically accurately and with stability. A distance between the second elevating/lowering head 92 and another member (the second driving source 91, the second bracket 95, etc.) can thus be shortened.

Also, the vertical movement of the second elevating/lowering head 92 can be guided by a simple arrangement in which the second elevating/lowering head 92 and the second guide member 97 are recess-projection engaged. The dimension of the shielding plate elevation/lowering driving unit 54 in the vertical direction Z can thus be suppressed even further.

Also, the shielding plate elevation/lowering driving unit 54 is isolated from the atmosphere inside the housing space A inside the chamber 3 by the second isolating member 75. The second driving source 91 and the second elevating/lowering head 92 can thus be disposed higher than the lower surface 30B of the base plate 30 regardless of amount or type of substance that splashes or scatters in the atmosphere inside the housing space A of the chamber 3.

Also, the coiled wirings 78 are connected to the shielding plate 6 and is extensible and contractible vertically. A dimension of the coiled wirings 78 in the vertical direction Z is thus adjusted in accordance with the elevation and lowering of the shielding plate 6. Therefore, in comparison to wirings (wirings that are not coiled), which do not extend or contract vertically when elevating or lowering the shielding plate 6 and are arranged to be adjusted in a dimension in the vertical direction Z by vertically moving downwardly hung U-shaped portions, a required space can be decreased in the vertical direction Z by using the coiled wirings 78.

The extension and contraction of the coiled wirings 78 can be guided by the wiring guide 79 and therefore tipping of the coiled wirings 78 and protrusion of a portion of the wirings 78 in a horizontal direction can be prevented.

Damage of the bellows 77 due to the wirings 78 contacting the bellows 77 can thereby be prevented. In other words, there is no need to secure a large space inside the bellows 77 for extension and contraction of the wirings 78. The bellows 77 can thus be made small and the shielding plate elevation/lowering driving unit 54 and the wirings 78 can thus be disposed inside the chamber 3 without burdening the housing space inside the chamber 3.

Also, the shielding plate elevation/lowering driving unit 54 is disposed directly below the horizontal movement ranges of the nozzle arms 51. The space below the nozzle arms 51 can thus be utilized to suppress the dimension of the processing unit 2 in the vertical direction Z.

The present invention is not restricted to the preferred embodiment described above and may be implemented in yet other modes.

For example, shielding plate elevation/lowering driving unit 54 may have the same arrangement as the guard elevation/lowering driving units 67 to 69. That is, the arrangement may be such that the second driving source 91 of the shielding plate elevation/lowering driving unit 54 includes a driving motor 91B that rotates a horizontally extending rotating shaft 91A and the second rotation transmitting unit 93 of the shielding plate elevation/lowering driving unit 54 includes a plurality of rack teeth that are formed on the second elevating/lowering head 92 and are aligned vertically, and pinion teeth that are provided at a tip of the rotating shaft 91A and engage with the rack teeth.

Oppositely, an arrangement is possible where each of the first driving sources 81 of the guard elevation/lowering driving units 67 to 69 includes a driving motor 81B that rotates a vertically extending rotating shaft 81A and each of the first rotation transmitting units 83 of the guard elevation/lowering driving units 67 to 69 includes a vertically extending thread shaft, to which the rotation of the corresponding rotating shaft 81A is transmitted, and a nut, fixed to the corresponding first elevating/lowering head 82 and screwed onto the thread shaft.

Also, in regard to each of the guard elevation/lowering driving units 67 to 69 of the present preferred embodiment, a mode where a portion of the bottom plate 84A of the bracket 84 is positioned below the lower surface 30B of the base plate 30 was described. However, with each of the guard elevation/lowering driving units 67 to 69, the entirety may be positioned above the lower surface 30B of the base plate 30 and the entirety may be housed in the housing space A. Further, in regard to each of the guard elevation/lowering driving units 67 to 69, it suffices that at least the first driving source 81 and the movable range E of the first elevating/lowering head 82 are disposed higher than the lower surface 30B of the base plate 30, and a mode is also possible where the first driving source 81 is not housed in the housing space A but is disposed at a side of the chamber 3.

Also, in regard to the shielding plate elevation/lowering driving unit 54 of the present preferred embodiment, a mode where the entirety is housed in the housing space A was described. However, a mode where the entirety of the shielding plate elevation/lowering driving unit 54 is not housed in the housing space A is also possible. That is, as long as the second driving source 91 and the movable range F of the second elevating/lowering head 92 are positioned above the lower surface 30B of the base plate 30, a mode is also possible where the second driving source 91 is not housed in the housing space A but is disposed at a side of the chamber 3. Also, a portion of the first bracket 94 or the second bracket 95 may be positioned lower than the lower surface 30B of the base plate 30.

Also, the elevation/driving unit is not restricted to those driving the elevation and lowering of the guards 64 to 66 and the shielding plate 6 and may be applied to various members, such as the cups 61 and 62 and the nozzles 41, 42, and 43, etc., that are elevated and lowered inside the housing space A of the chamber 3.

The present application corresponds to Japanese Patent Application No. 2016-024955 filed in the Japan Patent Office on Feb. 12, 2016, and the entire disclosure of the application is incorporated herein by reference.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A substrate processing apparatus comprising:
a chamber, including a base plate having an upper surface that defines a lower side of a housing space;
a substrate holding unit that is housed in the housing space of the chamber, is placed on the upper surface of the base plate, and holds a substrate;
a circular cylindrical guard that surrounds the substrate held by the substrate holding unit and is arranged for being elevated and lowered inside the housing space of the chamber; and
a guard elevation/lowering driving unit that elevates and lowers the guard between an upper position at which an inner peripheral surface of the guard faces a peripheral end surface of the substrate held by the substrate holding unit, and a lower position at which an entirety of the guard is positioned lower than the substrate held by the substrate holding unit,
wherein the guard elevation/lowering driving unit includes a driving source disposed higher than a lower surface of the base plate, and an elevating/lowering head that is connected to the guard and is moved vertically by the driving source within a movable range in which an entirety of the elevating/lowering head is positioned higher than the lower surface of the base plate,
an entirety of the driving source is disposed at a side of the movable range of the elevating/lowering head,
the elevating/lowering head is disposed at a side of the guard, and
the driving source includes a driving motor that is located directly below the guard at a position higher than the lower surface of the base such that a portion of the driving source is located outward from the guard in a radial direction of the guard.

2. The substrate processing apparatus according to claim 1, wherein the driving source is housed inside the housing space of the chamber.

3. The substrate processing apparatus according to claim 1, wherein the driving source further includes a rotating shaft that is rotated by the driving motor and extends horizontally, and
the guard elevation/lowering driving unit includes a rotation transmitting unit that transmits the rotation of the rotating shaft to the elevating/lowering head to move the elevating/lowering head vertically.

4. The substrate processing apparatus according to claim 3, wherein the rotation transmitting unit includes a plurality of rack teeth, fixed to the elevating/lowering head and aligned vertically, and pinion teeth, which are engaged with the rack teeth and to which the rotation of the rotating shaft is transmitted.

5. The substrate processing apparatus according to claim 1, wherein the driving source further includes a rotating shaft that is rotated by the driving motor and extends vertically, and the guard elevation/lowering driving unit includes a rotation transmitting unit that transmits the rotation of the rotating shaft to the elevating/lowering head to move the elevating/lowering head vertically.

6. The substrate processing apparatus according to claim 5, wherein the rotation transmitting unit includes a vertically extending thread shaft, to which the rotation of the rotating shaft is transmitted, and a nut, fixed to the elevating/lowering head and screwed onto the thread shaft.

7. The substrate processing apparatus according to claim 1, wherein the guard elevation/lowering driving unit includes a guiding unit that guides the vertical movement of the elevating/lowering head.

8. The substrate processing apparatus according to claim 7, wherein the guiding unit includes a guide member, fixed to the chamber and recess-projection engaged slidably with the elevating/lowering head.

9. The substrate processing apparatus according to claim 1, further comprising: an isolating member that isolates the guard elevation/lowering driving unit from an atmosphere inside the housing space inside the chamber.

10. The substrate processing apparatus according to claim 1, further comprising: a fluid supplying nozzle that supplies a fluid to the substrate held by the substrate holding unit; and a nozzle arm that moves the fluid supplying nozzle horizontally, wherein the guard elevation/lowering driving unit is disposed directly below a horizontal movement range of the nozzle arm.

11. The substrate processing apparatus according to claim 1, wherein the elevating/lowering head moves linearly in a vertical direction, and the driving source drives the linear movement of the elevating/lowering head in the vertical direction.

12. The substrate processing apparatus according to claim 1, wherein the guard includes a first guard, and a second guard that surrounds the first guard, the elevating/lowering head includes a first guard elevating/lowering head and a second guard elevating/lowering head that are connected to the first guard and the second guard, respectively, and the driving source includes a first driving source and a second driving source that are located along a circumferential direction of the guard so as to be adjacent to each other, and move the first guard elevating/lowering head and the second guard vertically, respectively.

13. The substrate processing apparatus according to claim 1, wherein the driving source includes a rotating shaft that is rotated by the driving motor and extends horizontally from the driving motor radially outward, the elevating/lowering head is located outward from the guard in the radial direction, and the guard elevation/lowering driving unit includes a rotation transmitting unit that transmits the rotation of the rotating shaft to the elevating/lowering head to move the elevating/lowering head vertically.

14. The substrate processing apparatus according to claim 9, wherein the isolating member includes a housing that is located directly below the guard and houses an entirety of the driving source and a lower portion of the elevating/lowering head, and a bellows that houses a portion of the elevating/lowering head protruding upward from the housing, and expands and contracts in accordance with the vertical movement of the elevating/lowering head.

15. A substrate processing apparatus comprising:

a chamber which includes a base plate having an upper surface that defines a lower side of a housing space;

a substrate holding unit that is housed in the housing space of the chamber, is placed on the upper surface of the base plate, and holds a substrate;

a shielding plate that faces an upper surface of the substrate held by the substrate holding unit and is elevated and lowered inside the housing space of the chamber;

a shielding plate elevation/lowering driving unit which drives the elevation and lowering of the shielding plate;

a coiled wiring that is connected to the shielding plate, is extensible and contractible vertically, and defines a cylindrical space extending vertically; and a shaft shaped wiring guide that is elevated and lowered together with the shielding plate, is inserted to the cylindrical space, and guides the extension and contraction of the wiring, wherein the shielding plate elevation/lowering driving unit includes a driving source that is disposed higher than a lower surface of the base plate, an elevating/lowering head that is connected to the shielding plate and is moved vertically by the driving source within a movable range in which an entirety of the elevating/lowering head is positioned higher than the lower surface of the base plate, and a rotation transmitting unit that transmits the rotation of the rotating shaft to the elevating/lowering head to move the elevating/lowering head vertically, the driving source includes a driving motor which is disposed higher than a lower surface of the base plate, and a rotating shaft which is rotated by the driving motor and extends vertically, the rotation transmitting unit includes a vertically extending thread shaft to which the rotation of the rotating shaft is transmitted, and a nut which is fixed to the elevating/lowering head and screwed onto the thread shaft, and the wiring guide extends in parallel to the thread shaft.

16. The substrate processing apparatus according to claim 15, further comprising: an isolating member that isolates the shielding plate elevation/lowering driving unit from an atmosphere inside the housing space of the chamber, wherein the isolating member includes a bellows that is extensible and contractible vertically and houses the wiring and the wiring guide.

* * * * *